United States Patent [19]
Lamberson

[11] Patent Number: 5,845,230
[45] Date of Patent: Dec. 1, 1998

[54] APPARATUS AND METHOD FOR THE REMOTE MONITORING OF MACHINE CONDITION

[75] Inventor: Roger E. Lamberson, San Diego, Calif.

[73] Assignee: SKF Condition Monitoring, San Diego, Calif.

[21] Appl. No.: 791,246

[22] Filed: Jan. 30, 1997

Related U.S. Application Data

[60] Provisional application No. 60/010,839 Jan. 30, 1996.
[51] Int. Cl.⁶ .............................. G01M 7/00; G08C 17/00
[52] U.S. Cl. .............................. 702/56; 702/188; 379/49; 455/67.1; 340/683; 340/825.06; 73/660
[58] Field of Search .............................. 364/508, 551.01, 364/222.2; 379/49; 455/67.1, 67.2, 67.3, 115; 340/870.01, 870.11, 856.4, 679, 680, 682, 683, 825.06, 825.23, 825.72; 73/593, 658, 660; 702/56, 188

[56] References Cited

U.S. PATENT DOCUMENTS

| | | | |
|---|---|---|---|
| 4,491,290 | 1/1985 | Douglas | 246/169 A |
| 4,502,041 | 2/1985 | Penzien | 340/532 |
| 4,535,411 | 8/1985 | Blackburn et al. | 364/508 |
| 4,559,828 | 12/1985 | Liszka | 73/658 |
| 4,621,263 | 11/1986 | Takenaka et al. | 340/870.07 |
| 4,704,906 | 11/1987 | Churchill et al. | 73/660 |
| 4,758,964 | 7/1988 | Bittner et al. | 364/508 |
| 4,839,830 | 6/1989 | Amey et al. | 364/551.01 |
| 4,885,707 | 12/1989 | Nichol et al. | 702/56 |
| 4,908,785 | 3/1990 | Cubbins et al. | 364/576 |
| 4,977,516 | 12/1990 | Shepherd | 364/508 |
| 5,029,101 | 7/1991 | Fernandes | 364/483 |
| 5,034,729 | 7/1991 | Lundquist | 340/683 |
| 5,142,278 | 8/1992 | Moallemi et al. | 340/825.06 |
| 5,201,834 | 4/1993 | Grazioli et al. | 246/169 R |
| 5,239,468 | 8/1993 | Sewersky et al. | 364/424.03 |
| 5,430,663 | 7/1995 | Judd et al. | 702/188 |
| 5,433,111 | 7/1995 | Hershey et al. | 73/593 |
| 5,442,810 | 8/1995 | Jenquin | 455/66 |
| 5,594,953 | 1/1997 | Ross et al. | 455/89 |

OTHER PUBLICATIONS

Franklin P. Antonio, et al., "OmniTRACS: A Commercial Ku–Band Mobile Satellite Terminal and its Applicability to Military Mobile Terminals", *IEEE* pp. 0761–0764 (1988).

Irwin M. Jacobs, "An Overview of the OmniTRACS: The First Operational Two–Way Mobile Ku–Band Satellite Communications System", *Elsevier Space Communications* 7:25–35 (1989).

Edward G. Tiedemann, Jr., et al. "The OmniTRACS Mobile Satellite Communications and Positioning System", pp. 503–507 (date unknown).

Qualcomm Brochure, "OmniTRACS Two–Way Satellite–Based Mobile Communications" (date unknown).

*Primary Examiner*—Eric W. Stamber
*Attorney, Agent, or Firm*—Knobbe, Martens, Olson, & Bear, LLP

[57] ABSTRACT

Vibration data is transmitted from a remote site to a control facility using wireless data transmission. In one embodiment, the vibration signal is conditioned and digitized, and then sent via satellite to a hub satellite receiving station. From the hub satellite receiving station, the data may be sent to the control facility via the public telephone network.

8 Claims, 3 Drawing Sheets

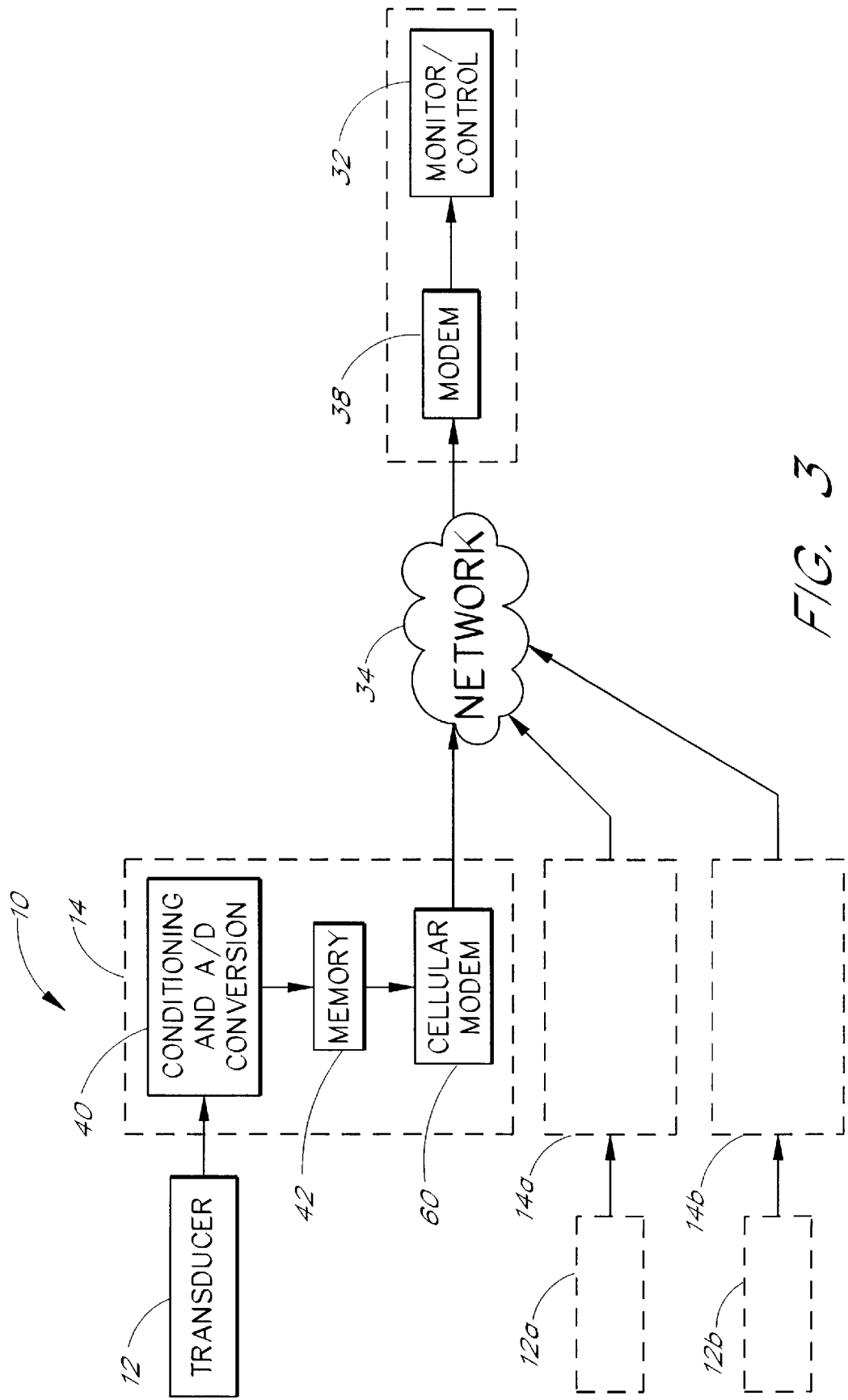

APPARATUS AND METHOD FOR THE REMOTE MONITORING OF MACHINE CONDITION

RELATED APPLICATIONS

This application claims priority under 35 U.S.C. § 119 to U.S. Pat. application Ser. No. 60/010,839 filed Jan. 30, 1996 now abandoned.

BACKGROUND OF THE INVENTION

1. Field of the Invention

The present invention relates to vibration monitoring sensors and equipment. More specifically, the present invention relates to the remote monitoring of the condition of rotating machinery with vibration sensors when it is difficult or unsafe to retrieve data from the sensors locally.

2. Description of the Related Technology

The need to accurately predict excessive wear, functional abnormalities, or the imminent malfunction of machines such as pumps, turbines, and the like is well known. It has become common to use vibration transducers which convert an operating machine's mechanical vibrations into an electrical signal which can be analyzed for characteristics which indicate abnormal operation or the need for maintenance. It can be appreciated that resources can be more efficiently utilized in manufacturing facilities and other environments when machine failure can be predicted, and the machine fixed or replaced prior to catastrophic failure. Human safety is also improved if the incidence of significant machine malfunction is reduced or eliminated.

Two approaches have been used to generate the vibration data necessary to perform these monitoring functions. In some installations, a portable probe is carried around the facility by facility personnel, and is used to collect vibration data from various locations on the machinery being monitored. These portable probes may include an integral vibration transducer, or may utilize fixed transducers at the points to be measured. Such a system is described in U.S. Pat. No. 4,885,707 to Nichol, et al. In the apparatus disclosed by Nichol, a computer interface module is also included for communication of measurement parameters and vibration data between the portable probe and a host computer system at the facility.

An alternative design, one example of which is provided in U.S. Pat. No. 5,430,663 to Judd, et al., includes a plurality of fixed transducers connected by a common bus which interfaces with an on-site host computer system.

A variation of these two systems is disclosed in U.S. Pat. No. 4,621,263 to Takenaka et al. In this system, a robot with a non-contact vibration sensor moves throughout the facility, communicating vibration data to a host computer system either with a hard-wired cable connection, or alternatively with a wireless communication link. This robotic device is stated to be especially useful in nuclear power plants, where the use of plant personnel to gather vibration data may expose people to unacceptable hazardous environments.

In all of the above-described systems, however, a locally based vibration monitoring presence is required. In most cases, monitoring personnel collect data at the machines themselves. In some cases, data is routed via communication cable to an on-site host monitoring computer which is itself manned by facility personnel. In many applications, however, it is infeasible to maintain any local presence for the purpose of vibration monitoring. Some pipeline sections, pumping stations, and the like may include a very small number of machines to be monitored, and be located tens or even hundreds of miles away from a suitable host location. In such situations, equipment is often allowed to run to failure because vibration monitoring to diagnose abnormalities cannot be performed.

There is accordingly a need in the art to provide remote vibration monitoring in a cost effective manner to allow efficient maintenance of such remote machines. To date, no long distance communication method has been considered and applied to this problem. It may be noted that satellite communication techniques have been applied to vibration data gathering in the electric power distribution industry, as is described in U.S. Pat. No. 5,029,101 to Fernandes, and in the railroad transportation industry, as is described in U.S. Pat. No. 5,433,111 to Hershey et al. In these fields, however, installation and management of dedicated long distance communication links is often already performed for other purposes, and is also more economically justifiable for a huge number of railroad cars, for example, than when a fairly small number of stationary and remote machine installations must be monitored.

Furthermore, those of skill in vibration data collection and analysis at facilities having stationary rotating machinery are typically not trained or extensively exposed to digital electronics or communications technologies. This general unfamiliarity in the relevant art with the capabilities of these technologies has slowed their application to machine monitoring. In fact, the employment of digital technology in vibration data collection is often resisted as its use is perceived to introduce undesired complexities into facility management. A remote monitoring system should therefore be easy to install and use, and should require a minimum of specialized on-site electronics which must be configured and maintained by process control management.

SUMMARY OF THE INVENTION

The present invention provides an efficient and easily managed communication link between a remote stationary machine and a control room having a host control computer system for analysis of machine condition and process control. Most preferably, embodiments of the present invention allow wireless communication between the remote site and the host control facility over communication links supported by an existing infrastructure. This minimizes the amount of communications equipment which must be managed by facility managers, thereby freeing them to concentrate on bearing fault analysis and machine maintenance. In particularly preferred embodiments, a portion of the communication link between the monitored machine and the host control room comprises the public switched telephone network.

Accordingly, one preferred embodiment of the present invention comprises a vibration monitoring system including a vibration transducer coupled to a piece of stationary machinery comprising rotating shafts supported in one or more bearings. Proximate thereto, a satellite transmitter is provided which is coupled to the vibration transducer and is configured to transmit vibration data to a satellite. Remote from the transducer is a satellite receiving station configured to receive the vibration data from the satellite. In a particularly preferred embodiment, the satellite receiving station comprises a modem connected to the public switched telephone network, and the vibration data is transmitted to a remote control room via the public switched telephone network.

Methods of communicating vibration data are also provided by the present invention. For example, a method of monitoring the condition of a stationary rotating machine is provided by the present invention comprising the steps of coupling a vibration transducer to rotating machinery, conditioning an analog output signal from the vibration transducer to produce a second analog signal indicative of the condition of the rotating machinery, and periodically sampling the second analog signal with an analog to digital converter to produce a set of digital samples of the second analog signal. These digital samples are preferably stored, and then transmitted via satellite to a satellite transmission hub station remote from the rotating machinery. Furthermore, the step of transmitting the digital samples from the satellite hub station to a control room remote from the rotating machinery and the satellite hub station is performed.

These apparatuses and methods thus defined provide high quality vibration data communication links without requiring process control management to develop, install, and maintain an extensive collection of communication equipment.

BRIEF DESCRIPTION OF THE DRAWINGS

FIG. 3 is a block diagram of the components of a vibration data communication system in accordance with a second preferred embodiment of the present invention.

DETAILED DESCRIPTION OF THE PREFERRED EMBODIMENT

Preferred embodiments of the present invention will now be described with reference to the accompanying Figures, wherein like numerals refer to like elements throughout. The terminology used in the description presented herein is intended to be interpreted in its broadest reasonable manner, even though it is being utilized in conjunction with a detailed description of certain specific preferred embodiments of the present invention. This is further emphasized below with respect to some particular terms used herein. Any terminology intended to be interpreted by the reader in any restricted manner will be overtly and specifically defined as such in this specification.

Figure 1:
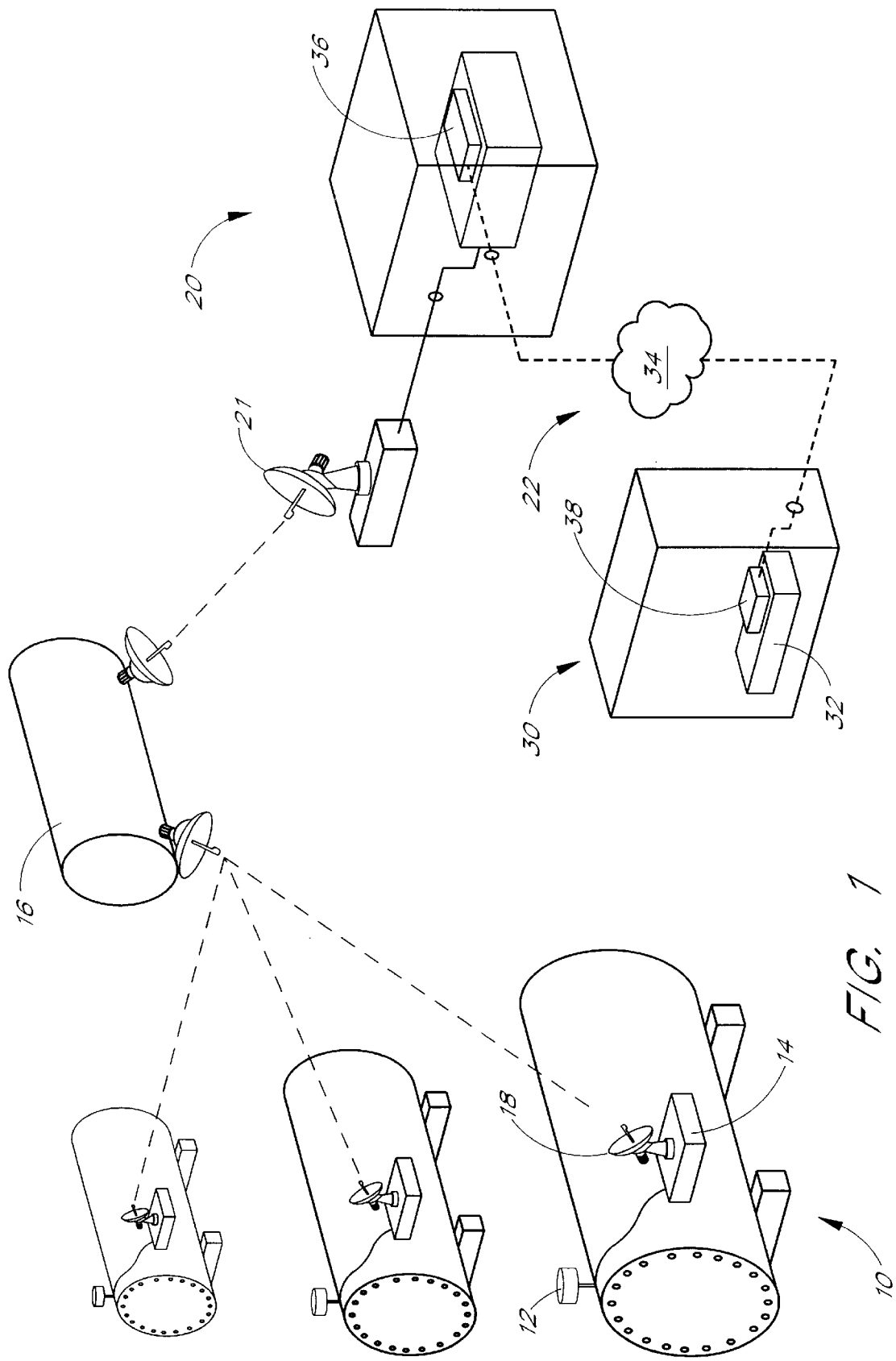
FIG. 1 is an illustration of a communication system connecting a stationary machine being monitored and a control room in accordance with one embodiment of the present invention.

Referring now to FIG. 1, a communication system in accordance with a preferred embodiment of the present invention is illustrated. A piece of machinery 10, a high speed pump for example, is located in a remote region relatively far from the location of facility management personnel. It is accordingly difficult and expensive to send a person to the pump itself to gather vibration data from the pump for evaluating its condition. It can be appreciated of course, that in some installations, along an oil pipeline, for example, several stationary machines (or several installations of groups of machines) may be periodically placed, each remote from one another. In these cases, several or all of the separate machines may require monitoring and periodic maintenance. In the following discussion, an individual installation of rotating machinery 10 is explicitly described, it being understood that the present invention may be utilized in an analogous manner with each additional separate installation.

The stationary machine 10 is provided with a vibration transducer 12 mounted to convert mechanical pump vibrations to an output analog electrical signal. Suitable transducers for this purpose are well known to those of skill in the art. Many standard configurations are described in the Third Edition of ANSI/API Standard 670, dated November 1993, the disclosure of which is hereby incorporated by reference in its entirety.

The transducer interfaces to a signal conditioner 14, which conditions and digitizes the analog transducer output signal as will be described in more detail below with reference to FIGS. 2 and 3. The digitized data is then preferably transmitted to a satellite 16 with a dedicated dish antenna 18. The dish antenna 18 can comprise a standard Very Small Aperture Terminal (VSAT) dish transceiver or any other satellite transmission antenna. In many applications, antenna size will be an important concern, in addition to cost. Those of skill in the art will be readily able to select an appropriate antenna type for a particular application.

The satellite 16 then retransmits the data to a hub receiver station 20, which includes a satellite receiving antenna 21. In many preferred embodiments of the present invention, the hub receiving station 20 will not need to be controlled or managed by the process control management, as communications services are commercially available to provide such satellite downlinks. This reduces the burden on pump facility management and allows them to concentrate on data analysis and facility maintenance, rather than on the operation and upkeep of a communications system.

It can of course be appreciated that the data received by the hub receiving station 20 must be then transmitted to the process control management. In some embodiments of the present invention, process control management is located at the hub receiving station, and no additional communication link is required. In some other embodiments, however, a communication link 22 is preferably provided between the hub receiving station 20 and a control room 30 containing the host monitoring computer system 32. In some applications of the present communication system, facility control and management is at a location remote from both the stationary monitored machine 10 and the hub receiving station 20. The communication link 22 may then advantageously comprise the public switched telephone network (PSTN) 34. The communication link 22 may also comprise a private telecommunications network, and may further include additional satellite links, microwave transmission, etc. As another alternative, the link 22 may comprise a packet switched network such as the Internet. In these embodiments, both the hub receiving station 20 and the control room 30 additionally comprise modems 36, 38 for data communication over the telephone line. Many of the above described embodiments further enhance the advantageous characteristics of the present system in that almost the entire communication link from the machine 10 to the control room 30 is supported by an existing communication infrastructure which is owned and managed by entities outside the process control management.

At the control room 30, the vibration data taken by the transducer 12 can be analyzed, and appropriate action according to the results of the analysis are then taken. In one embodiment, two way communication exists between the pump 10 and the control room 30. In this case, the control room 30 can send a command to the pump to shut down if the vibration measurements made by the transducer 12 indicate that bearing failure is imminent. In many cases, commands from the control room 30 will not be necessary, and the vibration data received by the control room 30 will be used to schedule appropriate maintenance procedures when the measured vibration data indicates that such maintenance is required. In some cases, personnel may be dispatched to manually shut down the machine 10 being monitored. The present system therefore incorporates a capacity for remote automatic machine 10 control, as well as increasing the efficiency of manual machine 10 control and maintenance.

Preferred components of the vibration data communication system of FIG. 1 will now be described with reference to FIG. 2. At the site of the stationary machinery 10, a vibration transducer is mounted so as to receive a mechanical acceleration signal from the machine, and translate that into an electrical signal. In typical applications, the transducer 12 comprises a piezoelectric crystal and an integral analog amplifier inside a housing. The transducer will generally also be provided with an output connector for outputting a voltage which varies with the instantaneous acceleration of the point on the machine 10 that the transducer contacts. Of course, the physical nature of the vibration transducer can vary and remain within the scope of the present invention, and the term "vibration transducer" is not hereby limited to any particular construction. Many different transducer configurations and modes of coupling them to stationary rotating machinery are well known. Some are described in the ANSI/API Standard 670-1993 mentioned above, and would be suitable for use with the present invention.

The transducer output is connected to an input to conditioning and A/D conversion circuitry 40. This circuitry can be configured to perform a variety of functions. In many applications, the analog acceleration signal is filtered to produce a varying DC voltage or current signal which is representative of the peak or RMS acceleration, velocity, or relative position of the transducer. As is well known to those of skill in the art, a variety of filtering techniques may be used to extract information regarding the performance and condition of the bearings in the stationary machinery 10. The filtered and conditioned signal is then sampled with an A/D converter to produce a series of digitized signal values. Of course, A/D conversion can occur at a rate which varies depending on the frequencies of interest in the signal being sampled. In some applications, the transducer output may be only amplified prior to A/D conversion and not conditioned or filtered. In this embodiment, conditioning and processing can be done at the control room 30. This can allow additional analysis flexibility, as the control room receives raw transducer data, and can process that data in various ways depending on the parameters of interest, recent history of the bearing being monitored, etc. In yet another alternative embodiment, the nature of processing performed by the conditioning and A/D conversion circuitry can be programmed with signals sent from the control room 30 to the remote site 10. In this embodiment, the conditioning circuit 40 may additionally comprise a memory, wherein commands stored in the memory control the particular conditioning function and filtering performed at a given time. Commands may be sent from the control room 30 for storage in the memory, thereby allowing remote control of the conditioning function, filter parameters, etc.

The conditioning and A/D conversion circuit outputs the digital data to an optional memory 42 which may comprise a non-volatile memory and be utilized to store data temporarily prior to transmission over the satellite communication link. The memory 42 may alternatively comprise a FIFO buffer which continually outputs, in real time, vibration data received from the conditioning and A/D conversion circuitry. This vibration data therefore comprises a baseband data stream which is routed to a modulator 44. The modulator 44 uses the baseband signal to modulate a signal for transmission to the satellite 16 at standard uplink frequency bands such as the Ku band.

In some preferred embodiments, additional transducers 12a, 12b and conditioning circuits 14a, 14b, may be provided on the machine 10 being monitored, or on other machines in close proximity to the machine 10 explicitly discussed above. In this case, the digital vibration data from all of the transducers 12, 12a, 12b can be multiplexed prior to modulation and transmission via the satellite link. Alternatively, each transducer/conditioner could include a dedicated satellite antenna for an independent link to the hub receiving station 20.

As was also explained above with reference to FIG. 1, the vibration data is transmitted from the satellite 16 to the receiving antenna 21 at the hub receiving station 20. It is there demodulated with a demodulator 50, and the digital data is stored in a memory 52 at the hub receiving station 20. As the hub 20 may be located a substantial distance from the control room 30, a communication link, preferably comprising the public switched telephone network 34, is provided from the hub receiving station 20 to the control room 30. The link through the telephone network can be continuously connected to provide real-time transfer of vibration data to the control room, or the link could be made periodically as the control room desires to receive information. In the latter case, the memory 52 can be used to store the vibration data until it is downloaded to the control room 30 via a telephone connection made between the control room 30 and the hub 20. As mentioned above, the hub 20 and control room 30 may be co-located at the same facility, in which case there is no need to use the telephone network.

An alternative embodiment of the present invention is illustrated in FIG. 3. In this embodiment, a satellite link is not necessarily present, but the advantages of the embodiment of FIG. 2 are preserved in that the communication link between the stationary machine being monitored 10 and the control room is supported by an existing infrastructure which need not be maintained and managed by the facility personnel who perform the vibration analysis and direct machine 10 operation.

Figure 2:
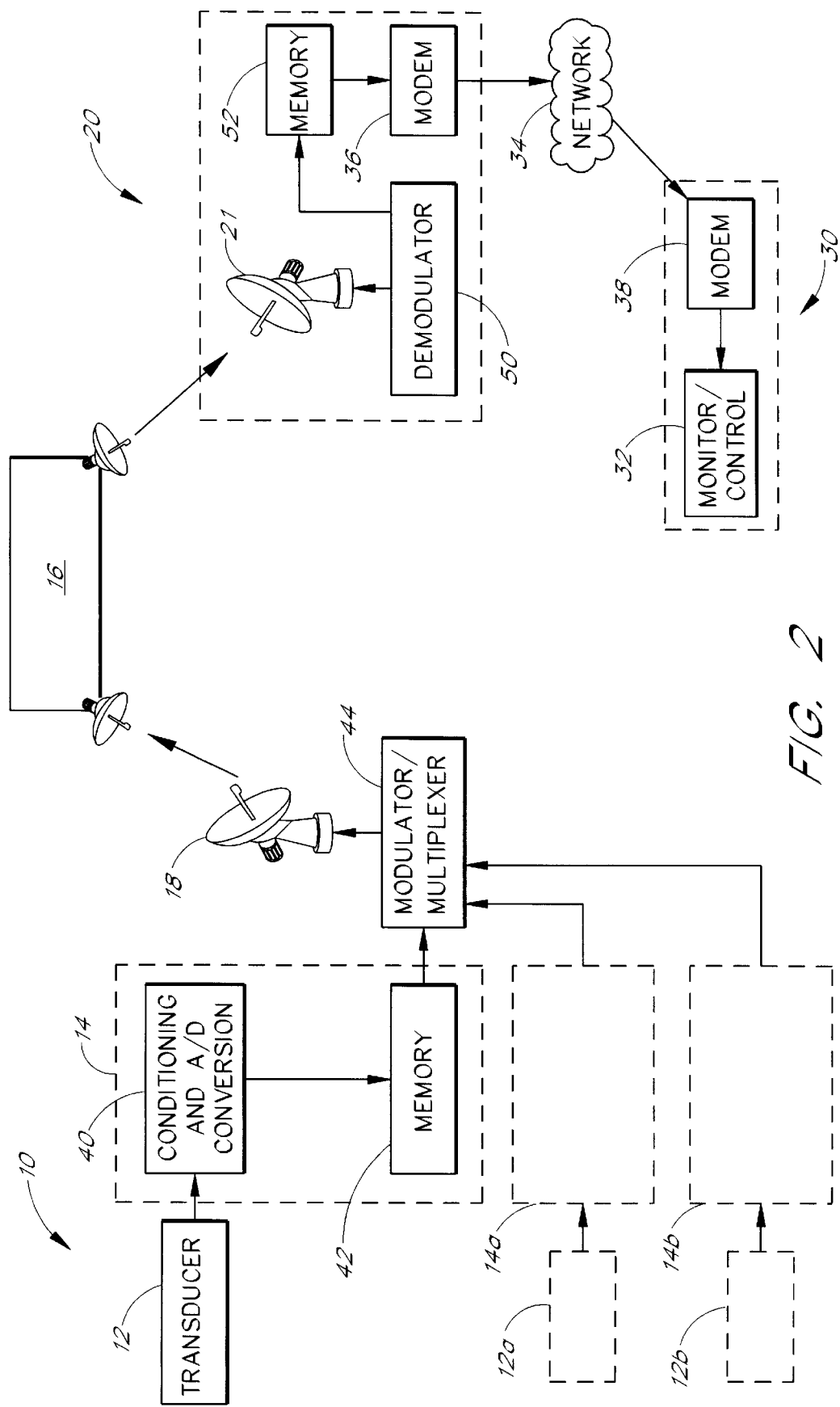
FIG. 2 is a block diagram of the components of a vibration data communication system in accordance with one preferred embodiment of the present invention.

The embodiment illustrated in FIG. 3 is analogous to that illustrated in FIG. 2 in that the transducer 12 is connected to conditioning and A/D conversion circuitry 40, which is in turn connected to the memory 42. The output of the memory 42, however, is input to a modem 60 which transmits directly to a communication network 34. This network 34 may comprise a private network, a public cellular telephone network, may include a satellite and/or microwave link, or may be wholly terrestrial. The data is then received by the modem 38 at the control room over a control room 30 connection to the network in a manner similar to that described above with respect to FIGS. 1 and 2. In effect, the transducer (or the control room) connects to the control room (or the transducer) over the network 34 when vibration data transmission is desired. Of course, this embodiment requires that either terrestrial or satellite cellular telephone service be supported in the area where the stationary machine 10 is located. In this embodiment as well, therefore, communication between the machine 10 and the control room 30 is easily managed and maintained by facility personnel. Facility managers simply connect the transducer 12 to the conditioning/wireless transmission circuit 14, and receive vibration data into the control room 30 from that transducer 12 via a standard telephone line. It will be appreciated by those of skill in the art than many communication protocols may be used with the present invention, including any of a number of switching techniques utilized and proposed for use in telecommunications networks, as well as techniques used in local or wide area computer networks.

The foregoing description details certain preferred embodiments of the present invention and describes the best mode contemplated. It will be appreciated, however, that no matter how detailed the foregoing appears in text, the invention can be practiced in many ways. As is also stated above, it should be noted that the use of particular terminology when describing certain features or aspects of the present invention should not be taken to imply that the broadest reasonable meaning of such terminology is not intended, or that the terminology is being re-defined herein to be restricted to including any specific characteristics of the features or aspects of the invention with which that terminology is associated. The scope of the present invention should therefore be construed in accordance with the appended Claims and any equivalents thereof.

What is claimed is:

1. A system for monitoring the condition of rotating machinery, comprising:

a plurality of stationary machines, each of said machines comprising a rotating shaft supported on bearings;

a plurality of vibration transducers, at least one of which is associated with each of said plurality of stationary machines, and which are configured to produce analog output signals indicative of bearing vibrations;

a plurality of signal conditioning circuits, at least one of which is associated with each of said plurality of stationary machines, wherein each signal conditioning circuit is configured to condition and digitize said analog output signals from at least one of said plurality of vibration transducers so as to produce a plurality of streams of digital vibration data;

a plurality of satellite transmitters, at least one of which is associated with each of said plurality of stationary machines, wherein said satellite transmitters are configured to independently transmit said streams of digital vibration data over a first communication link comprising a satellite communication link;

a satellite hub station remote from said plurality of stationary machines configured to receive all of said streams of digital vibration data over said first communication link, said satellite hub station comprising a memory for storing said streams of digital vibration data and additionally comprising a first modem for either continuously or periodically transmitting one or more of said streams of digital data over a second communication link separate from said first communication link; and a control room remote from both said plurality of stationary machines and said satellite hub station said control room comprising a second modem configured to receive either continuously or periodically said one or more of said streams of digital data from said second communication link separate from said first communication link, said control room additionally comprising a vibration data analysis system, whereby the condition of said machines may be monitored at said control room remote from said stationary machines.

2. A method of monitoring the condition of a stationary rotating machine, comprising the steps of:

coupling a vibration transducer to said rotating machine;

conditioning an analog output signal from said vibration transducer to produce a second analog signal indicative of the condition of said rotating machine; periodically sampling said second analog signal with an analog to digital converter to produce a set of digital samples of said second analog signal;

storing at least one of said set of digital samples;

transmitting said at least one of said set of digital samples via satellite to a satellite hub station remote from said rotating machine;

receiving and storing said at least one of said set of digital samples at said satellite hub station; and transmitting said at least one of said digital samples from said satellite hub station to a control room remote from both said rotating machine and said satellite hub station.

3. The method of claim 2, wherein said step of transmitting said at least one of said digital samples from said satellite hub station to a control room remote from said rotating machinery and said satellite hub station comprises transmitting said at least one of said digital samples through the public telephone network.

4. The method of claim 2, additionally comprising the steps of:

comparing said at least one of said set of digital samples with a predetermined value in said control room; and shutting down said rotating machinery if said at least one of said digital samples exceeds said predetermined value.

5. A vibration monitor system, comprising:

a vibration transducer coupled to a piece of stationary machinery comprising at least one rotating shaft coupled to one or more bearings;

a satellite transmitter coupled to said vibration transducer and configured to transmit vibration data to a satellite; and a satellite hub station remote from said vibration transducer and configured to receive said vibration data from said satellite and to store said vibration data in a memory at said satellite hub stations, said satellite hub station further comprising a modem coupled to a public switched telephone network, and a control room remote from said satellite hub station, said control room comprising a modem connected to said public switched telephone network so as to receive said vibration data from said memory at said satellite hub station.

6. A vibration monitoring system, comprising:

a plurality of stationary machines, each comprising a bearing, wherein at least two of said plurality of stationary machines are remote from one another;

vibration transducers coupled to said at least two of said plurality of stationary machines;

satellite transmitters coupled to said vibration transducers and configured to transmit vibration data to a satellite; and a satellite receiving station remote from said vibration transducers and configured to receive said vibration data from said satellite; and a control room remote from said stationary machines and remote from said satellite hub station wherein said control room comprises host monitoring and control computing facilities configured for vibration data analysis, and wherein said control room receives said vibration from said satellite hub station.

7. The vibration monitoring system of claim 6, additionally comprising ;

signal conditioning circuitry and a satellite transmitter coupled to said transducer so as to communicate vibration data to said satellite hub station, and wherein said signal conditioning circuitry is coupled to a memory; and a communication link between said control room and said satellite hub station such that vibration data is transmitted to said control room, and commands are transmitted from said control room and are stored in said memory.

8. The vibration monitoring system of claim 7, wherein said commands stored in said memory determine the conditioning function performed by said signal conditioning circuitry.

* * * * *